US008824218B2

United States Patent
Kim et al.

(10) Patent No.: US 8,824,218 B2
(45) Date of Patent: *Sep. 2, 2014

(54) COMPACT LOW-POWER ASYNCHRONOUS RESISTOR-BASED MEMORY READ OPERATION AND CIRCUIT

(75) Inventors: Seongwon Kim, Old Tappan, NJ (US); Yong Liu, Rye, NY (US); Bipin Rajendran, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

This patent is subject to a terminal disclaimer.

(21) Appl. No.: 13/552,932

(22) Filed: Jul. 19, 2012

(65) Prior Publication Data

US 2014/0078837 A1   Mar. 20, 2014

Related U.S. Application Data

(63) Continuation of application No. 12/960,651, filed on Dec. 6, 2010, now Pat. No. 8,331,164.

(51) Int. Cl.
    *G11C 7/06* (2006.01)
(52) U.S. Cl.
    USPC ....... 365/189.07; 365/148; 365/163; 365/205
(58) Field of Classification Search
    USPC .............................. 365/189.07, 148, 163, 205
    See application file for complete search history.

(56) References Cited

U.S. PATENT DOCUMENTS

| | | | |
|---|---|---|---|
| 5,406,521 A * | 4/1995 | Hara | 365/185.25 |
| 6,356,486 B1 * | 3/2002 | Banks | 365/189.15 |
| 6,438,051 B1 | 8/2002 | Fifield et al. | |
| 6,885,580 B2 | 4/2005 | Baker | |
| 7,417,911 B2 * | 8/2008 | Kuroda | 365/203 |
| 7,551,476 B2 | 6/2009 | Nirschl et al. | |
| 7,613,047 B2 | 11/2009 | Fales et al. | |
| 7,984,261 B2 * | 7/2011 | Park et al. | 711/170 |
| 8,081,530 B2 * | 12/2011 | Chou | 365/207 |
| 8,331,164 B2 * | 12/2012 | Kim et al. | 365/189.07 |
| 2008/0037317 A1 | 2/2008 | Liu et al. | |
| 2009/0129195 A1 | 5/2009 | De Brosse et al. | |
| 2009/0303785 A1 | 12/2009 | Hwang et al. | |
| 2010/0085799 A1 | 4/2010 | Cho et al. | |
| 2010/0110768 A1 | 5/2010 | Choi | |

FOREIGN PATENT DOCUMENTS

JP       2006-260697       9/2006

* cited by examiner

*Primary Examiner* — Pho M Luu
(74) *Attorney, Agent, or Firm* — Tutunjian & Bitetto, P.C.; Anne V. Dougherty

(57) ABSTRACT

A compact, low-power, asynchronous, resistor-based memory read circuit includes a memory cell having a plurality of consecutive memory states, each of said states corresponding to a respective output voltage. A sense amplifier reads the state of the memory cell. The sense amplifier includes a voltage divider configured to receive the output voltage of the memory cell and to output a settled voltage an amplifier having a voltage threshold between the settled voltages associated with two of said consecutive memory states, configured to discriminate between said two consecutive memory states.

8 Claims, 7 Drawing Sheets

| S/A7 | 1 |
| S/A6 | 1 |
| S/A5 | 1 |
| S/A4 | 1 |
| S/A3 | 0 |
| S/A2 | 0 |
| S/A1 | 0 |

COMPACT LOW-POWER ASYNCHRONOUS RESISTOR-BASED MEMORY READ OPERATION AND CIRCUIT

RELATED APPLICATION INFORMATION

This application is a Continuation application of U.S. patent Ser. No. 12/960,651 now U.S. Pat. No. 8,331,164, filed on Dec. 6, 2010, incorporated herein by reference in its entirety.

DECLARATION OF GOVERNMENT RIGHTS

This invention was made with Government support under Contract No. HR0011-09-C-0002 awarded by Defense Advanced Research Projects Agency (DARPA). The Government has certain rights in this invention.

BACKGROUND

1. Technical Field

The present invention relates to read circuits for resistor-based memory and, more particularly, to compact, low-power, asynchronous, read circuits for resistor-based memory.

2. Description of the Related Art

There has been increasing interest in resistor-based memory, such as magnetic RAM, phase-change memory, and memristor-based memory. In some systems requiring ultra-low power dissipation, such as neural network computing systems and wireless sensor networks, compact low-power memory read circuits are useful. In such systems, high computing speeds are not required, but the power to read memories should be very low to reduce energy dissipation and to extend battery life. In addition, many such systems operate asynchronously to save power.

Conventional resistor-based memory read circuits, called sense amplifier (S/A) circuits, are not energy efficient. Furthermore, many conventional S/A circuits require a clock signal, which prevents fully asynchronous operation. For example, such S/A circuits include voltage dividers or resistor dividers. However, all of these memory read operation schemes essentially use two clock phases: a precharge phase and a read phase. During the precharge phase, the bitlines are precharged to a certain voltage. During the read phase, the memory cell is connected to the bitlines and the bitline voltage difference caused by the memory cell is sensed and amplified by the memory read circuit. This type of operation is synchronous and needs a clock to function properly, which is unavailable in fully asynchronous systems.

Most existing S/A circuits are based on analog comparators or other types of amplifiers, which are neither compact nor energy efficient. See, for example, the comparator 10 of FIG. 1, which involves the use of many transistor components 12, each drawing power from voltage source 14 to produce an output 16. The high complexity of such analog comparators and their many powered components makes them unsuitable for low-cost, low power, asynchronous circuits. As such, there are no available compact S/A circuits for resistor-based memory which provide low-power, asynchronous operation.

SUMMARY

A system is shown that includes a memory cell having a plurality of consecutive memory states, each of said states corresponding to a respective output voltage, configured to receive a wordline signal and to output a voltage a sense amplifier configured to read a stored state of the memory cell. The sense amplifier further includes a voltage divider configured to receive the output voltage of the memory cell and to output a settled voltage and an amplifier having a voltage threshold between the settled voltages associated with two of said consecutive memory states, configured to discriminate between said two consecutive memory states and to produce a logical output that reflects the stored state.

A memory circuit is shown that includes a memory cell in one of N consecutive memory states, each of said states corresponding to a respective output voltage, where N is greater than or equal to three, configured to receive a wordline signal and to output a voltage and N−1 sense amplifiers configured to read a stored state of the memory cell. Each sense amplifier includes a voltage divider configured to receive the output voltage of the memory cell and to output a settled voltage and an inverter having a voltage threshold between the settled voltages associated with two of said consecutive memory states, configured to discriminate between said two consecutive memory states. The outputs of the sense amplifiers determine which of the N memory states is stored in the memory cell.

A memory circuit is shown that includes a memory cell having a plurality of consecutive memory states, each of said states corresponding to a respective output voltage; a memory write macro configured to receive the output voltage of the memory cell and further configured to change the state of the memory cell; a sense amplifier configured to read the state of the memory cell; and a switch configured to enable one of the memory write macro and the sense amplifier. The sense amplifier further includes a voltage divider configured to receive the output voltage of the memory cell and to output a settled voltage and an amplifier having a voltage threshold between the settled voltages associated with two of said consecutive memory states, configured to discriminate between said two consecutive memory states.

A method is shown that includes applying a wordline signal to a memory cell to generate a bitline output voltage, comparing the bitline output voltage to one or more voltage thresholds, and producing a logical output based on the threshold comparison that reflects a state stored in the memory cell.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 4 shows a schematic diagram of a memory circuit including a multi-level memory cell and multiple S/As;

DETAILED DESCRIPTION OF PREFERRED EMBODIMENTS

Figure 1:
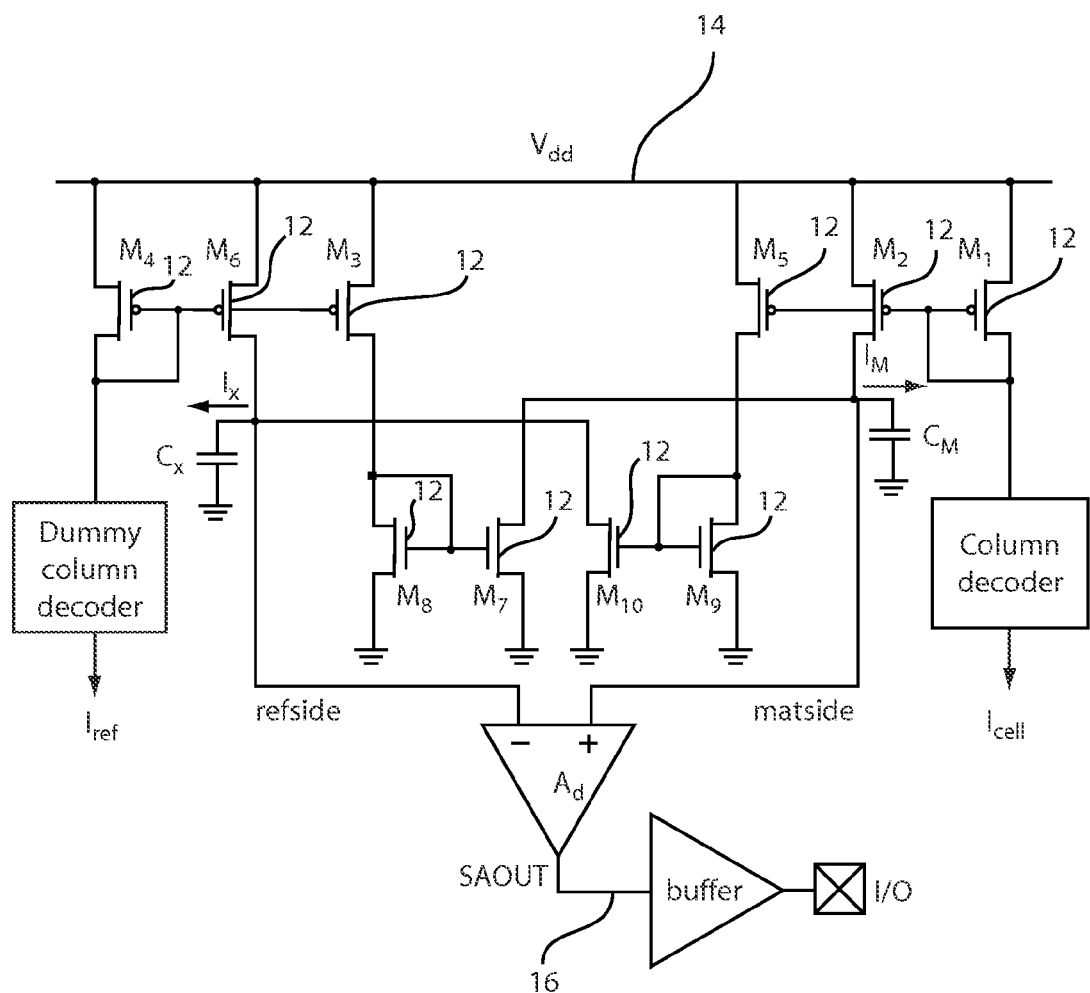
FIG. 1 shows a schematic diagram of an analog comparator.
Figure 2:
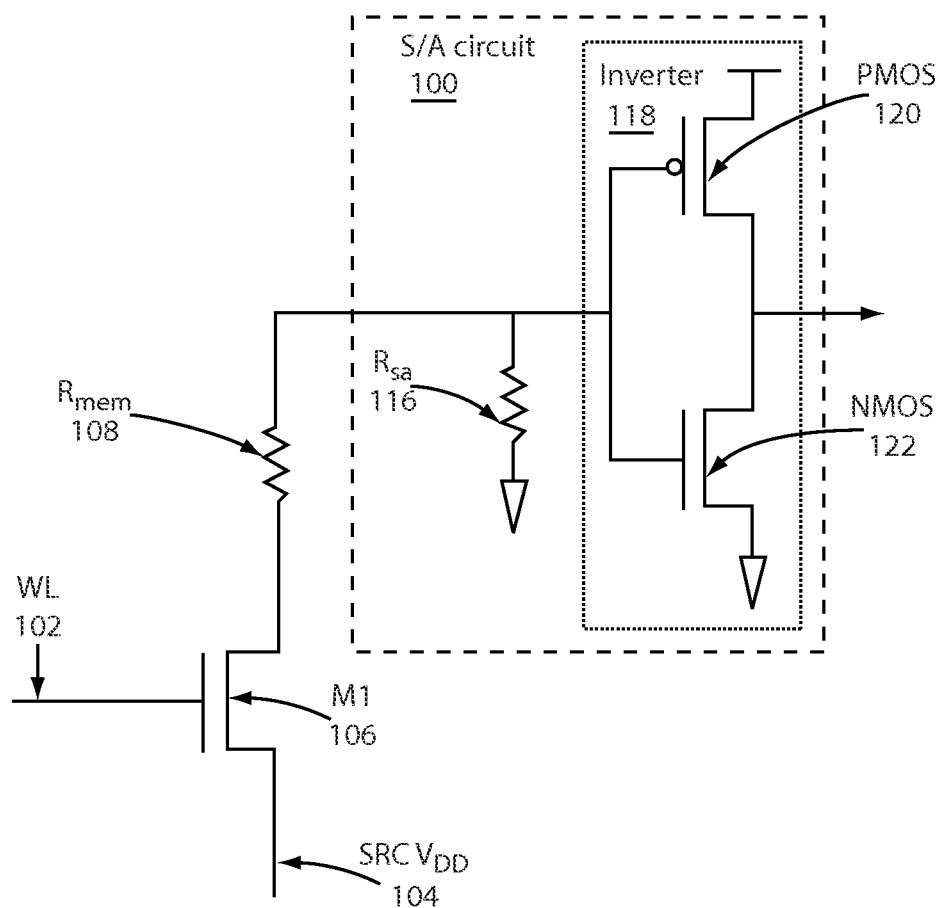
FIG. 2 shows a schematic diagram of a memory circuit including a sense amplifier (S/A) according to the present principles.

A compact, low-power, asynchronous sense amplifier (S/A) circuit can be implemented according to the present principles. Referring now to the drawings in which like numerals represent the same or similar elements and initially to FIG. 2, an exemplary design of such an S/A circuit 100 is shown in the context of a resistor-based memory circuit. This embodiment can be made very compact, as it may be based on a resistor (or a diode) and an inverter. Compared to an analog comparator (e.g., FIG. 1), the design of FIG. 2 is much smaller and uses less power. Furthermore, because the S/A is connected to the bitlines and because no S/A enable signal or clock signal is needed, fully asynchronous operation is possible. During a read operation, a pulse signal is applied to the gate of the memory access device, which makes the S/A circuit generate a pulse if the memory cell is in its low-resistance state. There is therefore no precharge phase and, hence, no clock signal is needed. Additional S/A circuits and outputs are possible if the memory cell has more than two memory possible states.

As will be appreciated by one skilled in the art, aspects of the present invention may be embodied as a system or method. Accordingly, aspects of the present invention may take the form of an entirely hardware embodiment or an embodiment combining software and hardware aspects that may all generally be referred to herein as a "circuit," "module" or "system."

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The circuits as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 8:
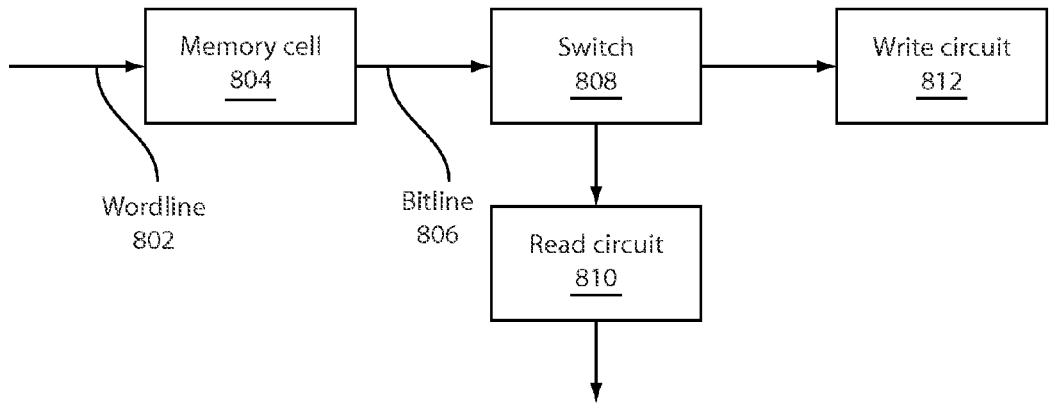
FIG. 8 shows a high-level block diagram of a resistor-based memory circuit.
Figure 9:
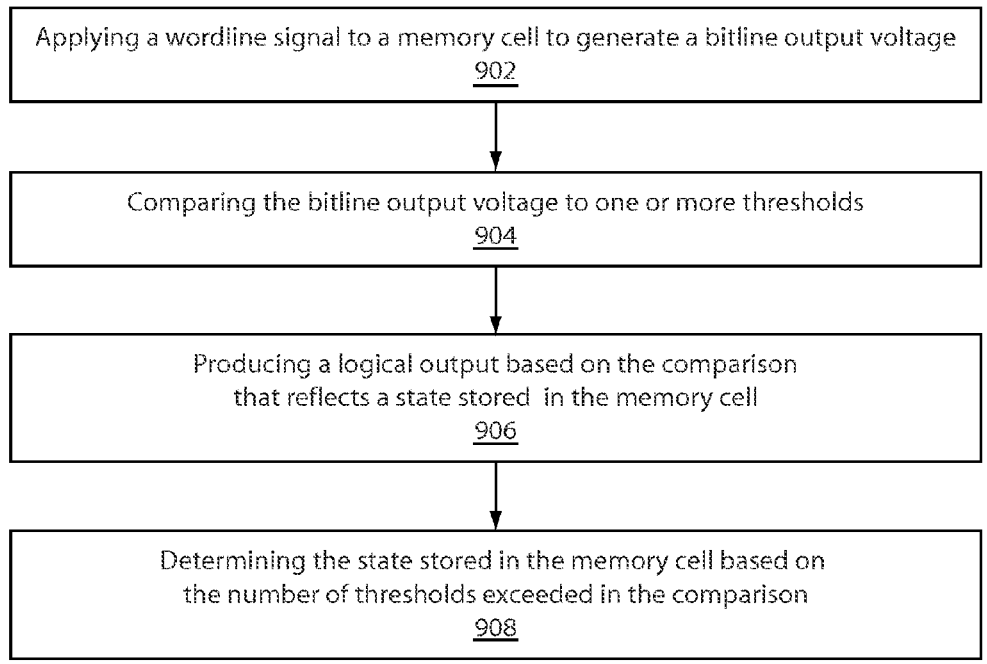
FIG. 9 shows a block/flow diagram illustrating a method for reading a stored memory state from a resistor-based memory cell.

Referring now to FIG. 8, a high-level diagram of a resistor-based memory circuit is shown. A wordline 802 is applied to a memory cell 804. The memory cell 804 produces a bitline 806, where the output voltage reflects the resistance state of the memory cell 804. A switch 808 determines whether this bitline is applied to a read circuit 810 or a write circuit 812. The read circuit 810 produces a logical output that reflects the stored state of the memory cell 804.

Referring now to FIG. 2, a resistor-based memory circuit with an S/A circuit 100 according to the present principles is shown. A memory cell, $R_{mem}$ 108 stores a memory state and can be modeled as a variable resistor. An exemplary type of resistor-based memory is phase-change memory (PCM), wherein a temperature change causes the resistor to change between a high-resistance phase and a low-resistance phase. These phases are used to represent different logical outputs, and modern resistor-based memory cells can store multiple bits by implementing additional memory levels of resistance.

In one exemplary embodiment, the memory cell has two states: a high-resistance state ($R_{mem}=R_{hi}$) and a low-resistance state ($R_{mem}=R_{low}$). An exemplary phase change involves heating chalcogenide glass until it loses its crystallinity. The glass then cools into an amorphous state, representing its high-resistance state. The glass may be heated again, to a temperature above its crystallization point but below its melting point. This returns the glass to its crystalline state, having a much lower resistance. Although PCM is discussed herein for the purpose of illustration, any form of resistor-based memory may be employed.

Memory access is triggered by access device M1 106 which may, for example, be implemented as a metal-oxide-semiconductor field effect transistor (MOSFET). When a wordline signal WL 102 arrives at M1 106, source voltage $V_{DD}$ 104 is applied to memory cell 108. Current across the memory cell 108 is applied to the S/A circuit 110. The current across the memory cell 108 will reflect the memory cell's resistance and, hence, a logical state stored therein.

The S/A circuit 100 includes a resistor $R_{sa}$ 116 which implements a resistor divider in series with $R_{mem}$ 108 and M1 106 and goes to ground. An amplifier 118 is connected in parallel with the S/A resistor 116. The amplifier 118 may be implemented as an inverter comprised of two MOSFETs. MOSFETs are used herein for the purpose of illustration for their small component size, but it is contemplated that other forms of amplifiers or inverters may be used. A p-channel MOSFET (PMOS) 120 and an n-channel MOSFET (NMOS) 122 are connected as shown to a voltage source and to ground. When a voltage is applied to the inverter 118 that exceeds the triggering threshold voltage of the inverter, the NMOS 122 is activated and the PMOS 120 is turned off. This brings the voltage at the output of the inverter 118 to ground, producing a logical output of 0. When a voltage is applied to the inverter 118 that is below the inverter's threshold, the PMOS 120 is activated and the NMOS 122 is deactivated, producing a logical output of 1. In this fashion, the inverter 118 reverses logical value of the voltage applied to it.

In idle operation mode, access device M1 106 is off, so the voltage inside the S/A circuit is pulled to ground by $R_{sa}$ 116. As a low input is applied to the inverter 118, the inverter therefore produces a high output. During a read operation, a pulse is sent to access device M1 106. The voltage divider then generates a settled voltage:

$$V_{sa} = \frac{V_{DD}R_{sa}}{R_{sa} + R_{mem} + R_{M1}},$$

where $R_{M1}$ represents the resistances of access device M1 106, $R_{sa}$ represents the resistance in the voltage divider 116, and $R_{mem}$ represents the resistance of the memory cell 108. The inverter threshold voltage $V_{TH}$ is set such that $$\frac{V_{DD}R_{sa}}{R_{sa} + R_{hi} + R_{M1}} < V_{TH} < \frac{V_{DD}R_{sa}}{R_{sa} + R_{low} + R_{M1}},$$

where $R_{low}$ represents the resistance of the memory cell 108 in its low state and $R_{hi}$ represents the resistance of the memory cell 108 in its high state. When $R_{mem}=R_{hi}$, $V_{sa}$ is smaller than $V_{TH}$ and the inverter output stays high as a result. When $R_{mem}=R_{low}$, $V_{sa}$ is larger than $V_{TH}$ and the inverter output changes from high to low, producing a logical 0. Once WL 102 becomes low, access device M1 106 turns off and the settled voltage $V_{sa}$ drops back to ground. Therefore, the inverter output changes back to high, producing a logical 1.

Figure 3:
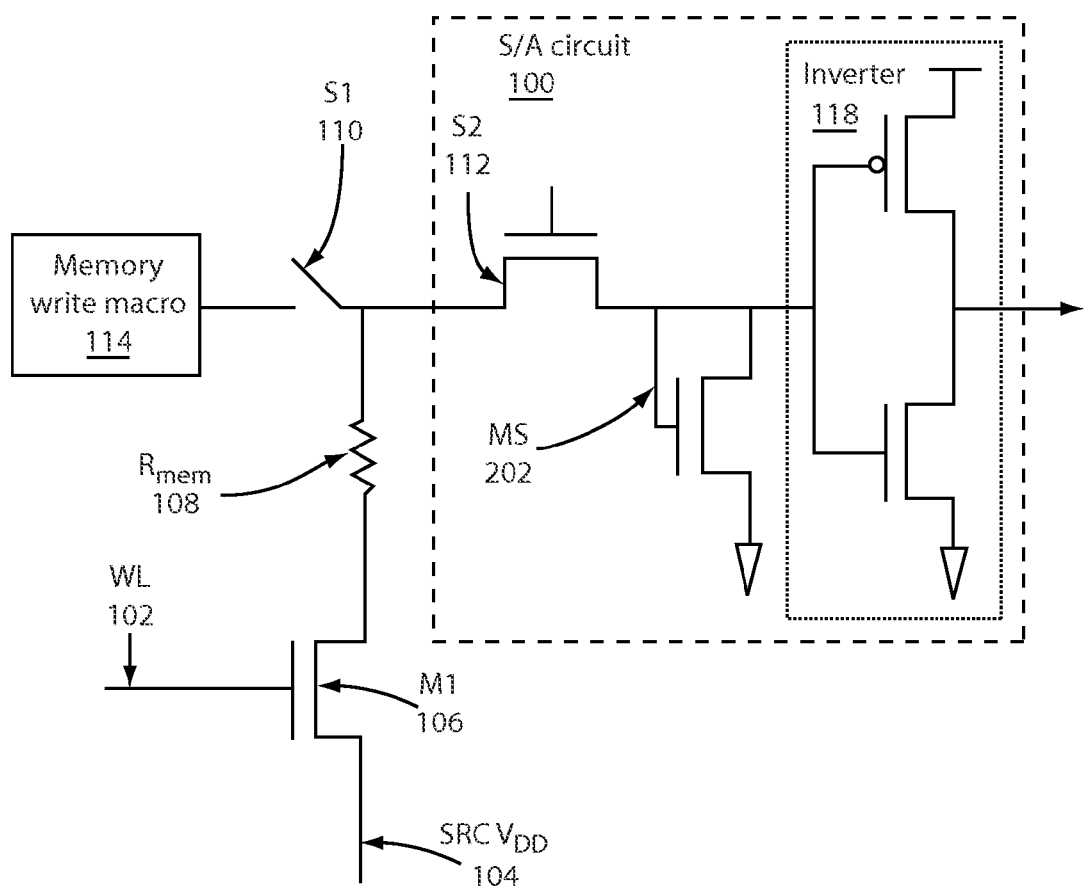
FIG. 3 shows a schematic diagram of a memory circuit including an S/A that uses transistors for switching voltage division.

Referring now to FIG. 3, another embodiment is shown in accordance with the present principles. A memory cell circuit 200 provides the ability to change the state of the memory cell. The operation of the memory cell circuit 200 is controlled by switches S1 110 and S2 112. As shown for switch S2 112, it is contemplated that the switches may be implemented as MOSFETs, in particular an NMOS, to further reduce circuit area. When S1 110 is closed, memory write macro 114 is engaged and the state of the memory cell 108 is changed accordingly. When switch S2 112 is closed, the S/A circuit 100 is engaged and the state of the memory cell 108 is read out. The switches 110 and 112 are controlled by write signals. During write operation, switch S2 112 is open, whereas during read and idle operations, switch S1 110 is open. A bitline output from memory cell 108 is always connected to the S/A circuit 100 in non-write conditions, such that in read operation, no S/A enable signal or clock signal is needed. This allows the S/A circuit to be operated asynchronously when used in the same circuit as a write macro.

The resistor $R_{sa}$ from FIG. 2 is replaced by an NMOS transistor wired as a diode M2 202 to further save area. To emphasize the potentially very small area consumed by a circuit of the present embodiment, the read circuit shown as the S/A circuit of FIG. 3 can be implemented in an area as small as, e.g., about 3.8 μm by 4.8 μm using a 0.90 nm process. Using a more precise process will permit even smaller circuit features.

Figure 4:
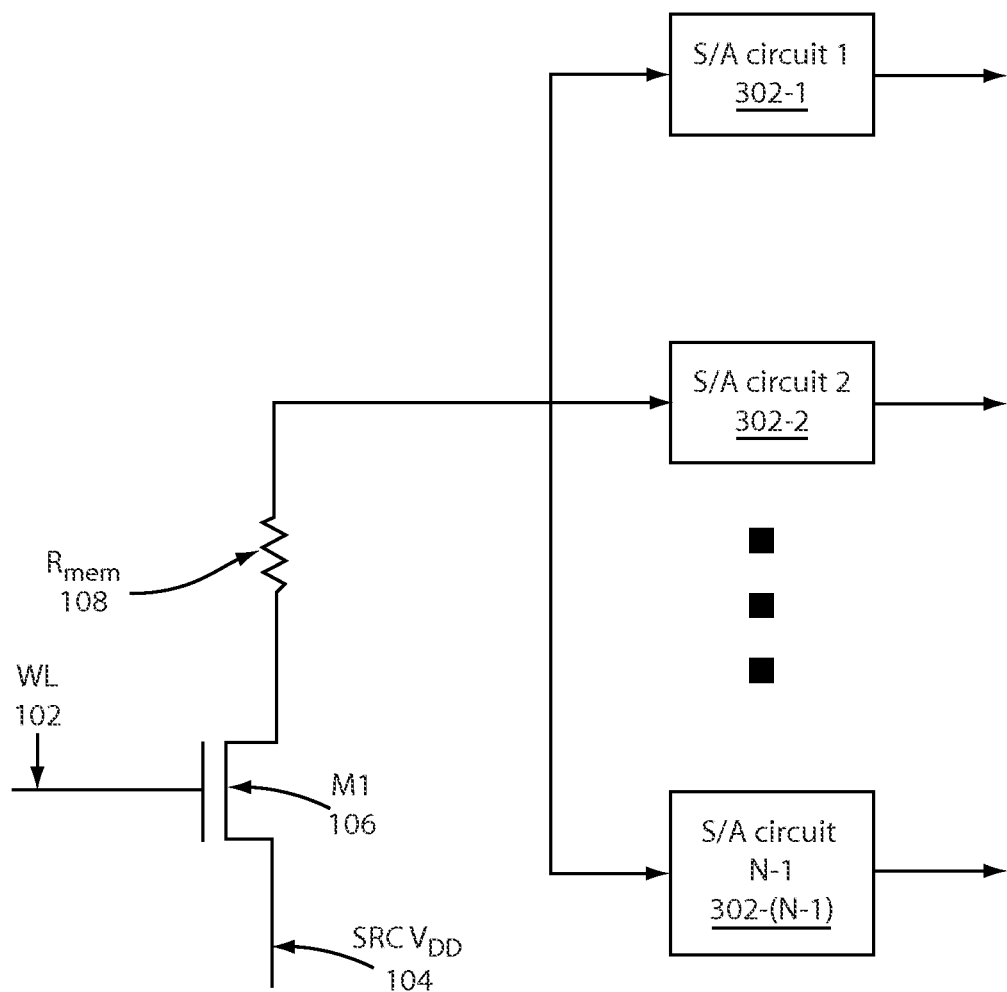

Referring now to FIG. 4, an embodiment of the present principles is shown that includes a multi-level resistor-based memory cell 108. In this embodiment the memory cell 108 has the ability to produce multiple (more than two) levels of resistance, allowing for the storage of additional bits of information. This is an advantage of resistor-based memory over conventional memories, such as SRAM, DRAM, and flash memory. Conventional memories have only two levels: 0 and 1. In resistor-based memories, the resistance of the memory cells can be programmed to be at different values, which means that multi-level memory is achievable with an appropriate read circuit, allowing more information to be stored in the same area.

To measure N memory cell levels, N−1 S/A circuits 301 are connected in parallel to the output of the memory cell 108. One exemplary way to detect N memory cell resistance values is to vary the N−1 inverter threshold voltages. In the N−1 S/A circuits 302, the diode transistors used in each are similar, but the S/A circuits have a different inverter threshold voltage. For example, $V_{TH,1} > V_{TH,2} > \ldots > V_{TH,N-1}$. If the maximum and minimum resistances are $R_{max}$ and $R_{min}$ respectively, then the voltage divider generates a settled voltage $$V_{sa} = \frac{V_{DD}R_{sa}}{R_{sa} + R_{S2} + R_{mem} + R_{M1}}$$

at each S/A's input. The $i^{th}$ inverter's threshold voltage $V_{TH,1}$ should be set between $$\frac{R_{sa}}{R_{sa} + R_{S2} + R_{M1} + R_{min} + (i-1)(R_{max} - R_{min})/(N-1)}$$

and $$\frac{R_{sa}}{R_{sa} + R_{S2} + R_{M1} + R_{min} + i(R_{max} - R_{min})/(N-1)}.$$

The $i^{th}$ inverter differentiates the memory resistance value smaller than $R_{min}+(i-1)(R_{max}-R_{min})/(N-1)$ and larger than $R_{min}+i(R_{max}-R_{min})/(N-1)$. The N−1 S/A output signals have a thermometer coding, representing the digitized memory resistance values. Thermometer coding represents an output value as a number of activated outputs. So, for example, having the first 5 S/A circuits output at 1 would represent a stored value of 5. Various inverter threshold voltages can be achieved by varying the width-to-length ratio of the PMOS and NMOS transistors in the S/A circuits 301.

In a circuit such as that shown in FIG. 4, where the memory cell 108 can be in one of eight different memory states, the cell 108 can effectively store three binary bits of information (in other words, the states represent 000, 001, 010, 011, 100, 101, 110, and 111). It should be noted that the number of S/A circuits needed to service a memory cell will be the $2^n$, where n is the number of bits. As such, it is not practical to increase the number of levels of the memory cell 108 indefinitely—at some point the space saved by the use of only a single memory cell will be outweighed by the cost of having additional read circuits. For example, one memory cell that stores four bits will use sixteen ($2^4$) S/A circuits, whereas two memory cells that store two bits each will use a total of eight ($2^2+2^2$) S/A circuits. As such, a memory cell having an appropriate number of elements should be selected to optimize power and space savings.

Figures 5, 6:
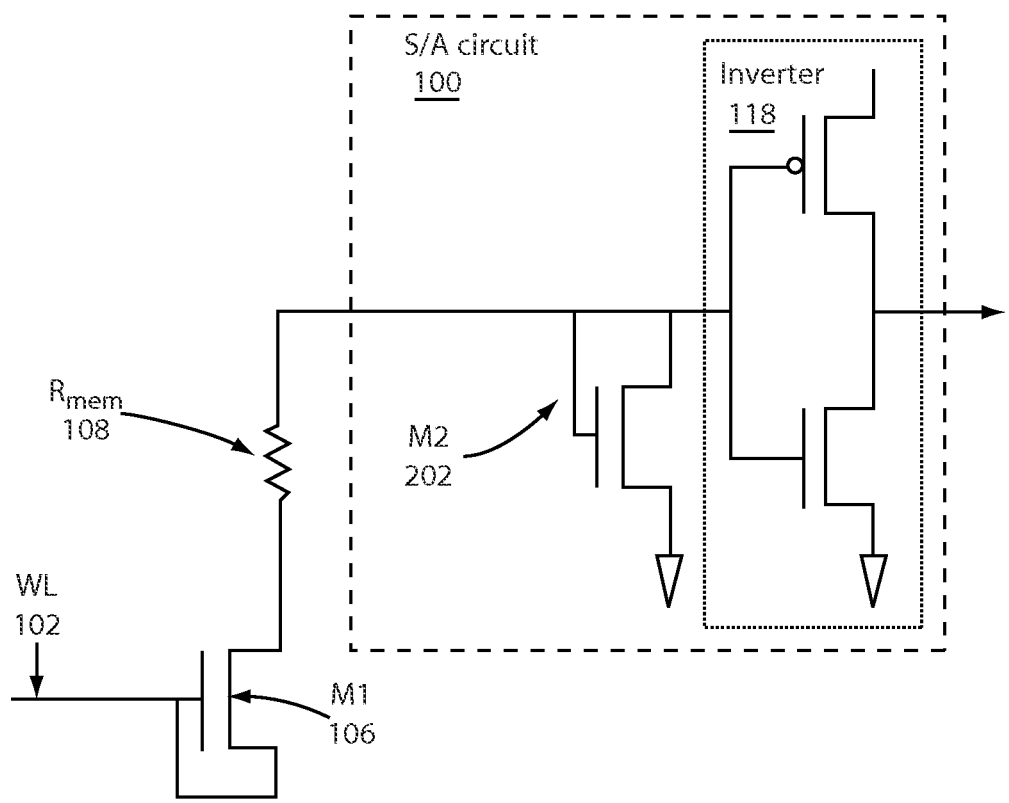
FIG. 5 shows a schematic diagram of a memory circuit including an input terminal configured as a diode.
FIG. 6 shows a diagram of the relationship between S/A output and stored memory cell values.

Referring now to FIG. 5, a further embodiment is shown where an input terminal M1 106 is configured as a diode. Signals coming from WL 102 pass through the diode 106. Implementing the input terminal as a diode further simplifies the circuit and provides additional space and power savings.

Referring now to FIG. 6, a table showing the output of a read circuit having an eight-level memory cell is shown. In this case, the memory cell is in the state i=4. This produces a voltage $V_{sa}$ that is between the threshold voltages of S/A3 and S/A4. As such, read circuits S/A1, S/A2, and S/A3 will be activated, producing a 0 output. The other four read circuits have a threshold voltage higher than $V_{sa}$, and they therefore continue to output 1.

Figure 7:
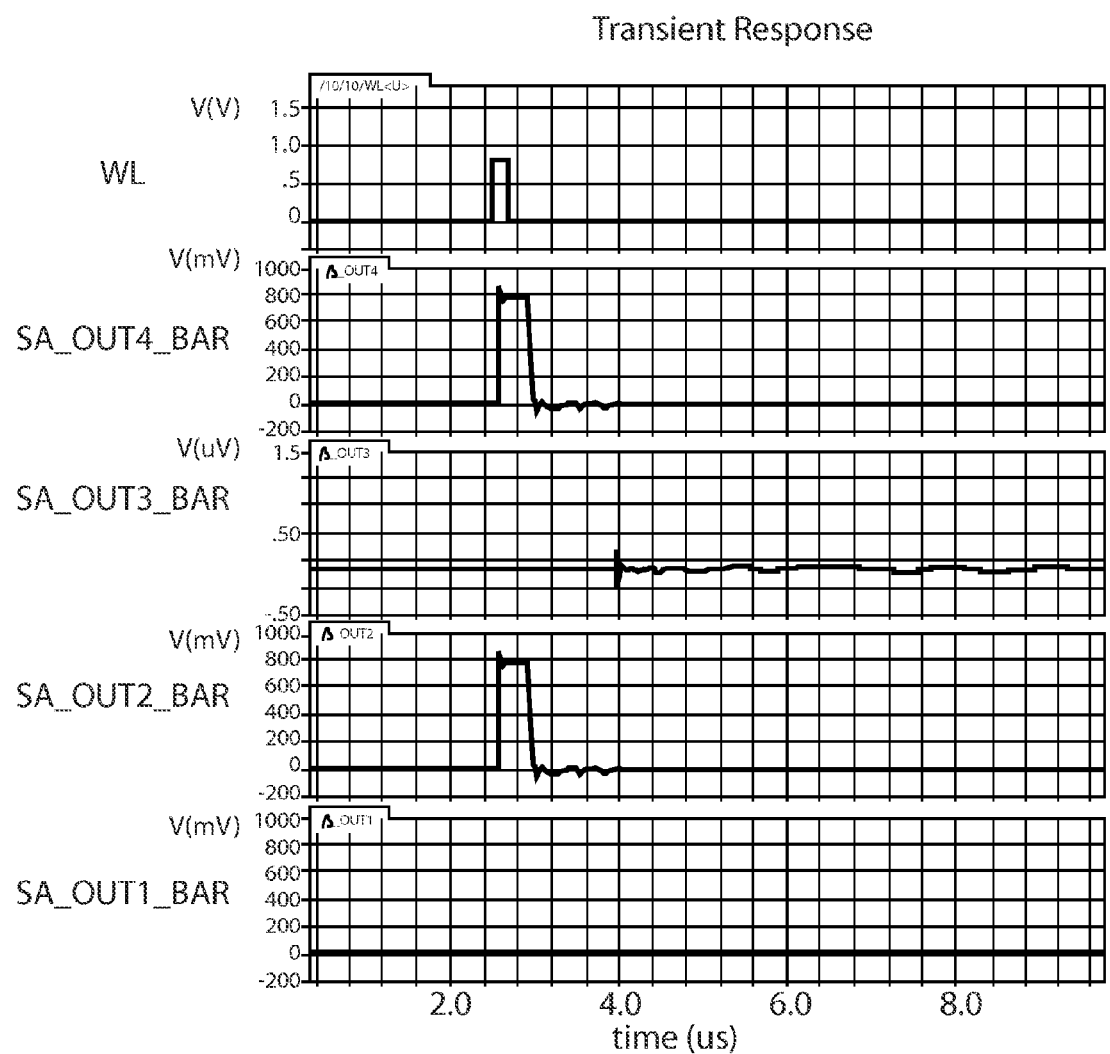
FIG. 7 shows a timing diagram of voltage over time for memory circuits having different stored memory values.

Referring now to FIG. 7, a timing diagram showing a simulation of multiple resistor-based memory read operations is illustratively depicted. There are four memory cells, shown as graphs SA_OUT1_BAR through SA_OUT4_BAR (the _BAR suffix denotes that the displayed graphs are the opposite of the actual outputs of the respective S/A circuits). The graphs show voltage level on the vertical axis and time on the horizontal axis. Cells 1 and 3 are set to a high-resistance state: $R_{mem}=R_{hi}$, e.g., 2 MΩ. Memories 2 and 4 are set to a low-resistance state: $R_{mem}=R_{low}$, e.g., 200 KΩ. At 2.5 µs there is a pulse on input WL. This generates pulses in the S/A outputs of cells 2 and 4, since they are set to the low-resistance state. The S/A outputs of cells 1 and 3 remain low, since cells 1 and 3 are in the high-resistance state. In this simulation, the read energy is 0.13 pJ/read. As can be seen from FIG. 7, neither the input nor the outputs require a clock signal, allowing for fully asynchronous operation. Inputs are processed as they arrive and outputs are provided without delay.

Referring now to FIG. 8, a block/flow diagram describing the operation of a resistor-based memory circuit according to the present principles is shown. At block 902, a wordline signal is applied to a memory cell to generate a bitline output voltage. As described above, any resistor-based memory cell may be used. The memory cell produces a bitline output, which is compared at block 904 to one or more thresholds. This comparison is then used in block 906 to produce a read output that reflects the state of the memory cell. The state of the cell is then determined at block 908 by counting how many of the thresholds were exceeded by the output voltage in the comparison.

Having described preferred embodiments of a system for low-power asynchronous resistor-based read operations (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system comprising:
   a memory cell having a plurality of consecutive memory states, each of said states corresponding to a respective output voltage, configured to receive a wordline signal and to output a voltage; and
   a sense amplifier configured to read a stored state of the memory cell, comprising:
      a voltage divider configured to receive the output voltage of the memory cell and to output a settled voltage; and
      an amplifier having a voltage threshold between the settled voltages associated with two of said consecutive memory states, configured to discriminate between said two consecutive memory states and to produce a logical output that reflects the stored state.

2. The system of claim 1, wherein the amplifier is an inverter.

3. The system of claim 1, wherein the voltage divider comprises a transistor having its source and gate terminals connected to the output voltage of the memory cell.

4. The system of claim 1, wherein the sense amplifier is configured to operate asynchronously, without a clock signal.

5. A method, comprising:
   applying a wordline signal to a memory cell to generate a bitline output voltage;
   comparing the bitline output voltage to one or more voltage thresholds; and
   producing a logical output based on the threshold comparison that reflects a state stored in the memory cell.

6. The method of claim 5, wherein comparing includes comparing the bitline output voltage to a plurality of voltage thresholds.

7. The method of claim 6, further comprising the step of determining the state stored in the memory cell based on a number of thresholds exceeded in the comparison.

8. The method of claim 5, wherein said applying, comparing, and producing are performed asynchronously, without a clock signal.

* * * * *